United States Patent [19]

Wilson

[11] Patent Number: 4,667,271
[45] Date of Patent: May 19, 1987

[54] ADJUSTABLE FRONT CONTROL PANEL FOR A TAPE TRANSPORT COMPONENT ARRANGEMENT

[75] Inventor: George A. Wilson, Portola Valley, Calif.

[73] Assignee: Ampex Corporation, Redwood City, Calif.

[21] Appl. No.: 418,906

[22] Filed: Sep. 16, 1982

[51] Int. Cl.⁴ .............................................. H05K 7/16
[52] U.S. Cl. ................................... 361/391; 292/218; 360/90; 361/380
[58] Field of Search ............... 361/331, 340, 343, 346, 361/358, 359, 360, 380, 390, 391, 395, 399; 174/52 R; 292/218; 312/282; 360/90; 248/201; 340/365 R; 400/682, 691, 693

[56] References Cited

U.S. PATENT DOCUMENTS

| | | | |
|---|---|---|---|
| 1,718,374 | 6/1929 | Oberst | 361/331 |
| 2,566,064 | 8/1951 | Keim | 174/52 R |
| 2,671,176 | 3/1954 | Landauer | 174/52 R |
| 2,856,450 | 10/1958 | Padgett et al. | 174/52 R |
| 2,994,807 | 8/1961 | Devine et al. | 361/391 |
| 3,787,637 | 1/1974 | McCarty et al. | 360/90 |
| 3,830,352 | 8/1974 | Kolpek | 400/682 |

Primary Examiner—A. D. Pellinen
Assistant Examiner—Gregory D. Thompson
Attorney, Agent, or Firm—Charles M. Carman; Harry G. Thibault; Joel D. Talcott

[57] ABSTRACT

A tape transport front panel is adjustable to position the controls conveniently for operators in various positions.

7 Claims, 6 Drawing Figures

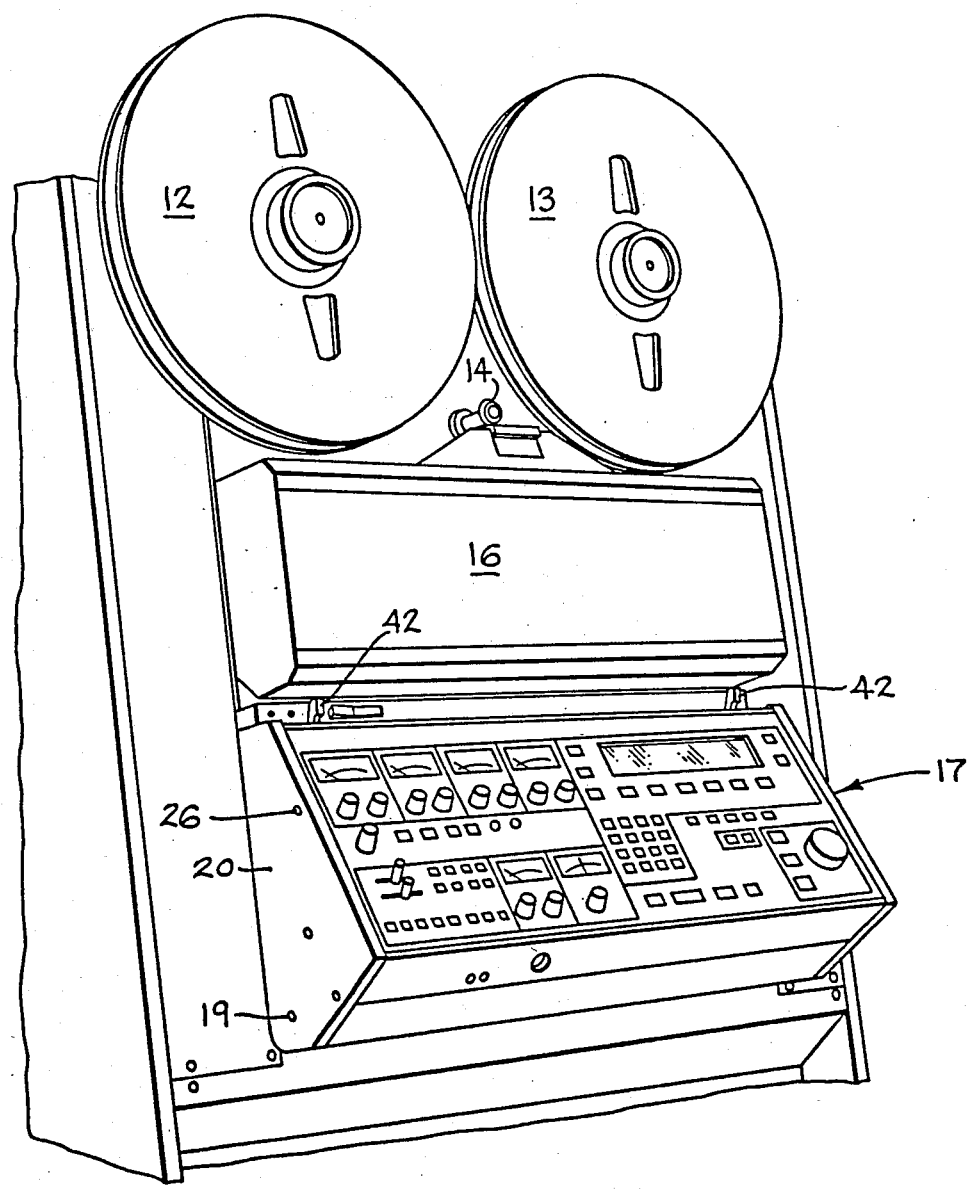
FIG_1

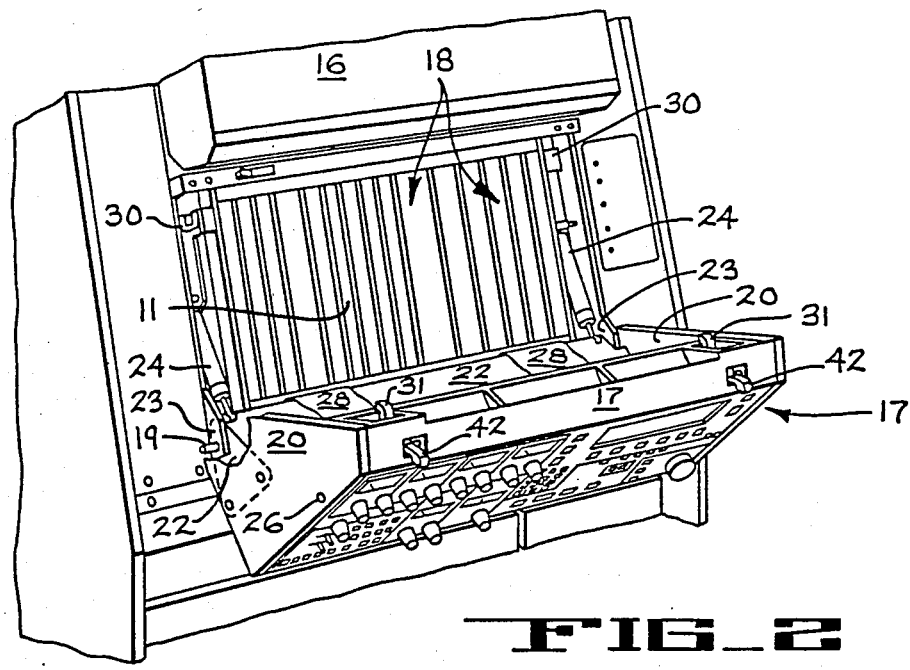
FIG_2
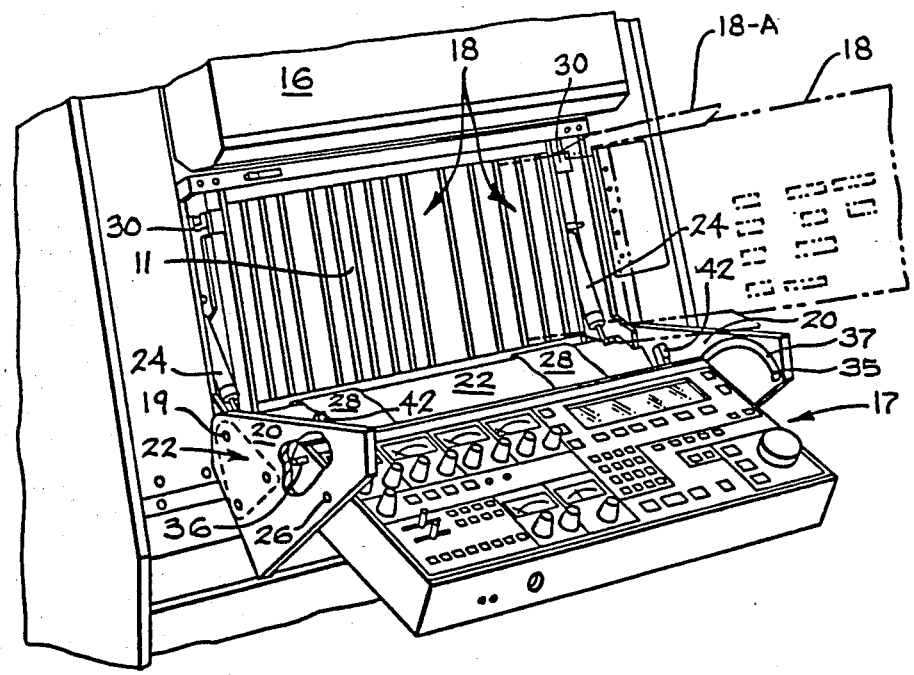
FIG_3

ADJUSTABLE FRONT CONTROL PANEL FOR A TAPE TRANSPORT COMPONENT ARRANGEMENT

This invention relates to tape transports, and particularly to the arrangement of components thereof.

In the tape transport art, the electronic circuit boards are usually arranged in parallel with vertical board orientations for efficiency of cooling. If one of the boards must be worked upon with the machine operating an "extender board" is used to mount the permanent board in an outboard-extended positon, which often interferes with access to the machine control panel. Also very large machines may be so tall that the operator must stand to obtain access to the upper positions, yet various circuit boards and other components must be located at lower levels and cannot be worked upon by a standing operator; particularly when the components must be repaired, it is more convenient to do the work while sitting, and adjacent to a table or work bench upon which tools and parts may be laid. In such cases it is desirable to have a control panel that is at the best level and inclination for either seated or standing operators. Since a single fixed level and inclination is not better than a compromise, it is desirable to have two possible levels and two possible inclinations for the panel. Given this requirement, it is further desirable to make use of the panel, which now must be movable in any case, as the cover door for the circuit board or component compartment, so that the compartment is uncovered whenever the operator adjusts the control panel for use in a seated position.

Accordingly, it is an object of the present invention to provide a control panel usable more conveniently, and by either seated or standing operators, and adapted as a cover for an interior compartment of the apparatus.

In a tall tape transport, the control panel is mounted in a relatively high and upstanding orientation for the convenience of a standing operator, but is formed as one end panel of a folding panel set, which in unfolding uncovers the interior component compartment for access of the operator, and at the same time disposes the control panel at a lower level and at a supine inclination more convenient for a seated operator, without loss of control or monitoring connection between the panel and machine.

DESCRIPTION OF THE DRAWINGS

FIG. 1 is a fragmentary perspective view of a portion of a tape transport showing the closed position of the panel of the invention;

FIG. 2 is a fragmentary perspective view of a portion of the apparatus shown in FIG. 1, showing the control panel in partly opened position;

FIG. 3 is a view similar to that of FIG. 2, showing the control panel in fully opened position, exposing an interior compartment of the apparatus;

DESCRIPTION OF THE PREFERRED EMBODIMENTS

Figure 4:
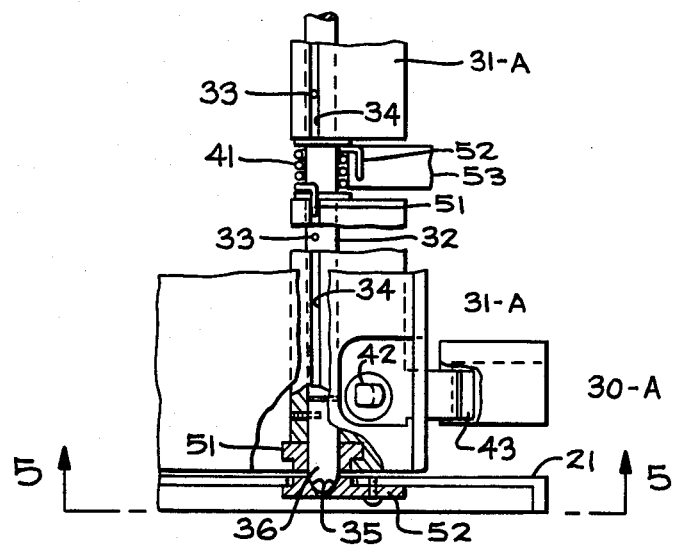
FIG. 4 is an enlarged broken-away plan view of a latch assembly of the invention shown in FIG. 1.

Referring now to FIG. 1, there is shown the front portion of a magnetic tape transport, including the so-called "top plate" or "tape deck", which in this example is in fact only slightly inclined from the vertical, the tape supply and takeup reels 12 and 13, respectively, a tape guide 14, a housing 16 for the tape capstan, scanner, tachometer, tension arms, and other items which may normally remain covered while the machine is running; and an inclined panel 17 for controls and indicators.

The panel 17 lies at about waist-height for a standing person, and the inclination shown in FIG. 1 is selected as being most convenient for observation of the indicators and operation of the controls by an operator in the standing position.

However, it is often desired to do extensive work upon circuit boards that are concealed behind the panel 17 (see, e.g., the boards 18 in FIGS. 2 and 3), particularly while the machine is running, and with the panel 17 still in a convenient position for retaining active control and monitoring of the machine; furthermore, such work upon and with access to the circuit boards 18 usually requires pulling the board out and mounting it upon an "extender" board 18-A as indicated in phantom in FIG. 3, the extender board 18-A being electrically connected to the machine. Also such work often is best accomplished by an operator seated in a chair beside a work table or bench upon which tools and parts may be laid.

Therefore, the present invention contemplates the opening of panel 17 in such a way that in its final position the circuit boards 18 are exposed and may be drawn orthogonally from the machine and maintained in the orthogonal position during the work thereon, and the panel 17 is in a good position, and at a suitable inclination, for control and monitoring by an operator either in the seated or standing position.

Such an opening arrangement is shown as taking place in two stages: in FIG. 2, the panel 17 is pivoted downwardly and outwardly from the panel 11 for more than 90 degrees on pivoting hinge pins 19 to expose the circuit boards 18; and in FIG. 3 the panel 17 is further pivoted, and on a different pivot axis 26, further outwardly and upwardly to a suitable inclination and elevation for use by a sitting operator.

The arrangement of FIG. 2 is also suitable in itself for use by a standing operator who desires only a momentary examination of the circuit board array, but does not wish to sit down, and does not need to retain control through panel 17 for the brief time period required for his examination.

The pivoting action from the position of FIG. 1 to the position of FIG. 2 is accomplished through the agency of a pair of simple pivot pins 19 extending into the sides of the extrusions 22, adjacent inner walls 21 of side panels 20, which with side panels 20, forms the middle panel of a folding panel set, of which the fixed panel 11 or frame and the panel 17 define the two end "panels" in the preferred embodiment. The pins 19 are received in brackets 23 extending from the front of the transport tape deck and chassis. The weight of the assembly of panel 17 and extrusions 22 is compensated for by means of springs or, as here shown, by so-called gas dampers 24.

The pivoting action from the position of FIG. 2 to the position of FIG. 3 is accomplished by means of simple pivoting hinge 26 extending from the side of the panel 17 and received in the side panels 20 The electrical continuity required between the controls and monitors of panel 17 and the interior of the transport is provided by means of cables and conductors arranged in ribbon form as at 28.

Figure 5:
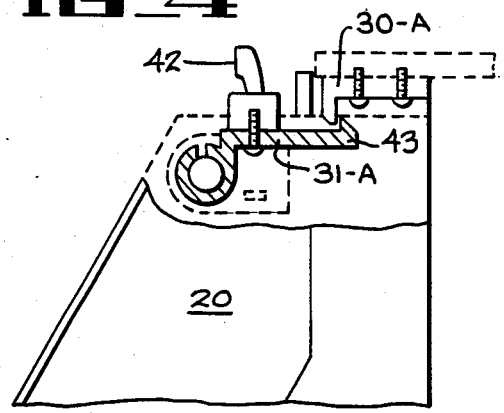
FIG. 5 is a broken-away end elevation view taken on the plane of lines 5—5 of FIG. 4.
Figure 6:
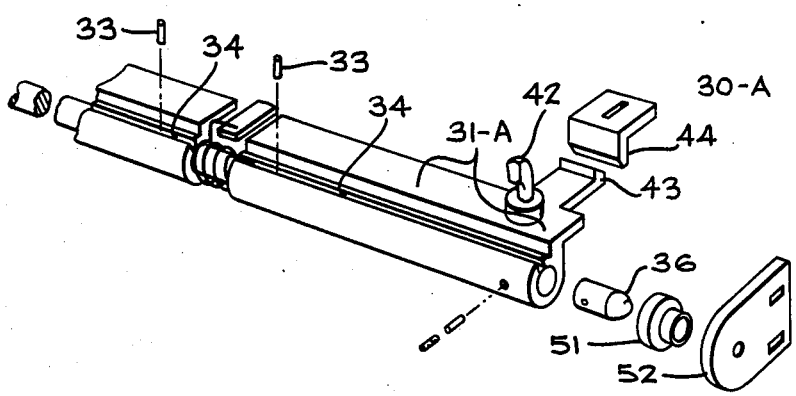
FIG. 6 is an exploded perspective view of the latch assembly of the apparatus shown in FIGS. 4 and 5.

Latching and unlatching of the panel 17 is provided for in both pivoting actions as by means of the apparatus shown in FIGS. 1-3. A pair of operating members consisting of pivoting hooked latches 31 (FIG. 2) are mounted for conjoint pivoting operation to hook into catches 30 in a downward direction. Alternatively, as shown in FIGS. 4-6, latches 31-A may hook upwardly into downwardly opening catches 30-A. As shown in FIGS. 4-6, the latches are mounted as by means of a rod 32, to which the latches are keyed as by means of pins 33 extending from the rod and riding in slots 34 in the latch members. Extending from the latches on the same axis are a pair of conically-tipped latch pins 36 (also shown in FIG. 3), which are retained in place by locking pins 36-A (FIG. 6) and ride in arcuate grooves 37 in the members 20 (FIG. 3), the grooves having deepened wells 35 (at either end) to catch and lock the pins 36 in the FIGS. 2 and 3 positions respectively. The latches are spring-loaded to be urged normally apart and into the wells 35, except when they are urged inwardly against the pressure of spring 41, which is a helical coil compression spring mounted on the rod 32 between the two latches 31(31-A). Extensions 42 are provided on the latches for such operation; and these extensions 42 may also be used to retract the hook-shaped portion 43 of the latches from the fixedly-mounted catches 44 at the top of the opening for the circuit boards.

Thus, when it is desired to open the panel 17 to the position of FIG. 2, the operator grasps one or both of the extensions 42 and pulls them toward himself (FIGS. 1-3) to release the latches 31 from the catches 44. Then he lowers the assembly to the position of FIG. 2, where the side panels 20 come to rest against the front of the machine. Then he moves both extensions 42 toward one another to release the pins 36 from the outer wells 35, and pivots the assembly to the position of FIG. 3, where the pins 36 snap into inner wells 35 (not visible in FIG. 3). To close the apparatus, a reverse sequential operation is conducted. Since the spring 41 may also be used as a torsion spring, one end 51 is hooked around a portion of the latch 31-A assembly and the other end 52 is hooked around an extension 53 of the panel 17 to load the latches 31-A toward the latching position with respect to catches 44.

The rod 32 should be short enough to permit axial movement, in the modification shown in FIG. 6 and sliding fit journal bearings 54 and well blocks 55 may be substituted for the extrusion 22 to receive the pins 36 if desired.

It will be apparent that the latches 31(31-A) may be arranged to hook either upwardly (as shown in FIGS. 4, 5) or downwardly (as shown in FIGS. 1-3) against oppositely hooking catches 44, and so that the extensions 42 must be pushed (FIGS. 4, 5) or pulled (FIGS. 1-3) to release the latches, without departing from the spirit and scope of the invention.

What is claimed:

1. Apparatus which mounts a control panel and a circuit board array in a tape transport, characterized in that:

said control panel is arranged as a cover for said circuit board array and is mounted by a double hinge means comprising first pivotable means secured to the transport lowering said control panel and second pivotable means secured to the transport tilting said panel to a different level and a relatively supine orientation for the convenience of a sitting operator when said control panel is opened to expose said circuit board array; and said control panel remains operative to monitor said tape transport in both an open and a closed position of the cover.

2. Apparatus which mounts a control panel as a cover of a circuit board array in a tape transport, characterized in that:

said control panel forms one end panel of a folding panel set, a second end panel being defined by a fixed front panel of the tape transport and including an opening for access to said circuit board array; and one hinge-pin axis of said folding panel set is positioned at a lower edge of said circuit board array to define a first pivotable means for the control panel, and a second hinge-pin axis is positioned at the top of said control panel to define a second pivotal means therefor.

3. Apparatus which mounts a control panel as a cover for an interior compartment for a tape transport, characterized in that:

said panel forms one end panel of a folding panel set;

said interior compartment has a frame forming a second end panel of said folding panel set, with said interior compartment being covered by said control panel in a generally upright position which is a folded position of said folding panel set, and at a height convenient for a standing operator;

first pivotable means provided between the one end panel and a middle panel of the folding panel set;

second pivotal means provided between the middle panel and the second end panel of the folding panel set; and said interior compartment is exposed in an unfolded position of said folding panel set, with said control panel being displayed at a lower, substantially supine inclination convenient for a sitting operator.

4. Apparatus as recited in claim 3, and also including latching and positioning means for holding said control panel in each of said folded and unfolded positions, and means for maintaining an electrical connection between said control panel and said tape transport in both of said positions.

5. Latching apparatus for a folding panel set arrangement useable in a tape transport machine, said arrangement comprising:

a latching rod assembly mounted for rotation and for axial movement along an axis between the control panel and the middle panel;

said middle panel having a pair of side panels and said control panel having a pair of journal members adjacent said side panels;

a pair of latch pins mounted in axial alignment with and at opposite ends of said rod and projecting through respective journal members and into openings in said side panel;

a pair of operating members including the journal members for said rod connected thereto for conjoint rotation therewith but for mutual axial sliding motion thereon, said operating members being secured to said latch pins for the axial operation of latching and unlatching said control panel and said middle panel, said operating members being spring-loaded toward a latching condition of;

said operating members having respective hand-hold extension portions manually operable to retract said latch pins for folding and unfolding action of said control panel and said middle panel;

said operating members also having a pair of hook-shaped latches engageable with a pair of corresponding hook-shaped catches formed on said front panel, said latches being pivotable upon rotation of said hand-hold portions about said rod to release said latches, and said operating members being spring-loaded toward a latching condition.

6. Latching apparatus as recited in claim 5, wherein said operating members are oriented with the hook-shaped latches pointing generally downwardly and the hooks of said catches pointing generally upwardly;

whereby said hand-hold portions must be pulled away from said tape transport to release said latches.

7. Latching apparatus as recited in claim 7, wherein said operating members are oriented with the or-shaped latches pointing generally upwardly and the hooks of said catches pointing generally downwardly;

whereby said hand-hold portions of said members must be pushed toward said tape transport to release said latches.

* * * * *

UNITED STATES PATENT AND TRADEMARK OFFICE
CERTIFICATE OF CORRECTION

PATENT NO. : 4,667,271

DATED : May 19, 1987

INVENTOR(S) : George A. Wilson

It is certified that error appears in the above-identified patent and that said Letters Patent is hereby corrected as shown below:

Column 1, line 14, delete "positon" and insert --position--;
         line 17, delete "positions" and insert --portions--;
Column 3, line  3, delete "hings 26" and insert --hinge pins 26--;
Column 6, line  8, delete "claim 7" and insert --claim 5--;
         line  9, delete "or-shaped" and insert --hook-shaped--.

Signed and Sealed this

Twenty-second Day of March, 1988

Attest:

DONALD J. QUIGG

Attesting Officer

Commissioner of Patents and Trademarks